(12) United States Patent
Chung-Zen

(10) Patent No.: US 7,585,724 B2
(45) Date of Patent: Sep. 8, 2009

(54) FLASH MEMORY DEVICE AND METHOD OF MANUFACTURE

(75) Inventor: Chen Chung-Zen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 535 days.

(21) Appl. No.: 11/125,867

(22) Filed: May 10, 2005

(65) Prior Publication Data

US 2006/0258089 A1 Nov. 16, 2006

(51) Int. Cl.
H01L 21/336 (2006.01)
H01L 29/788 (2006.01)
H01L 29/76 (2006.01)
H01L 21/792 (2006.01)

(52) U.S. Cl. ........................ 438/257; 257/315; 257/316; 257/319; 257/324

(58) Field of Classification Search ................. 438/257; 257/314–326, 390, 295, 298, 680, 681
See application file for complete search history.

(56) References Cited

U.S. PATENT DOCUMENTS

| 4,939,690 | A | 7/1990 | Momodomi et al. |
| 5,050,125 | A | 9/1991 | Momodomi et al. |
| 6,580,120 | B2 | 6/2003 | Haspeslagh |
| 6,638,821 | B1 * | 10/2003 | Hsieh ......................... 438/257 |
| 6,649,475 | B1 * | 11/2003 | Wen et al. ................... 438/267 |
| 6,686,632 | B2 * | 2/2004 | Ogura et al. ................. 257/374 |
| 6,714,457 | B1 | 3/2004 | Hsu et al. |
| 6,765,261 | B2 | 7/2004 | Widdershoven |
| 6,774,433 | B2 | 8/2004 | Lee et al. |
| 6,888,755 | B2 * | 5/2005 | Harari ...................... 365/185.02 |
| 2001/0024854 | A1 | 9/2001 | Takeuchi et al. |

OTHER PUBLICATIONS

Park, Jong-Ho et al., 8Gb MLC (Multi-Level Cell) NAND Flash Memory using 63nm Process Technology, 0-7803-8684-1/04, © 2004 IEEE, pp. 36.1.1-36.1.4.
Lee, June et al., High-Performance 1-Gb NAND Flash Memory With 0.12-um Technology 0018-920/02 © 2002 IEEE, pp. 1502-1509.
Kamins, Theodore I., "Effect of Polysilicon-Emitter Shape on Dopant Diffusion in Polysilicon-Emitter Transistors," 0741-3106/89/900/0401 © 1989 IEEE, 4 pages.

* cited by examiner

Primary Examiner—Chuong A. Luu
(74) Attorney, Agent, or Firm—Duane Morris LLP

(57) ABSTRACT

A FLASH memory device is provided including a plurality of first floating gates formed over a gate oxide layer formed over a substrate, the first group of floating gates being formed using a selected photolithography process associated with a minimum line width; a second group of floating gates including a plurality of second floating gates, wherein the first and second floating gates are disposed in series, with individual ones of the second floating gates disposed between respective ones of the first floating gates; a plurality of spacers, individual ones of the spacers disposed between adjacent ones of the first and second floating gates; a plurality of control gates associated with the floating gates, wherein the spacers and/or the second floating gates have widths less than the minimum line width.

16 Claims, 9 Drawing Sheets

FLASH MEMORY DEVICE AND METHOD OF MANUFACTURE

FIELD OF THE INVENTION

The present invention generally relates to FLASH memory devices and methods of making the same.

BACKGROUND OF THE INVENTION

NAND type EEPROMs (Electrically Erasable Programmable Read Only Memories) or FLASH memories have been considered as a replacement for hard disk drives (HDDs). It is therefore desired that these devices have larger capacities, lower cost, and reduced cell size for miniaturization and increased processing speed.

U.S. Pat. No. 5,050,125 (the '125 Patent) discloses a non-volatile semiconductor memory where each bit line comprises a series array of FLASH memory cells (shown in the cross-sectional view of FIG. 4 of the '125 Patent). Cell size or area is defined by the width of the floating gate and adjacent insulating region (X-direction of FIG. 4) by the width of the associated control gate and adjacent insulating region (in the Y-direction), i.e., the overlapping area needed for the floating gate and control gates. The cell size of each cell of the '125 Patent cannot be reduced beyond about $4F^2$-$5F^2$, where "F" is the minimum feature size or line width obtainable by a lithography technique used in the manufacturing process of the '125 Patent. This minimum feature size is believed to be currently about 90 nm. This conclusion assumes that the minimum width of the floating gate is about 1F and the minimum width of the spacing between adjacent floating gates in an array of floating gates is also about 1F, while the minimum width of the control gate is about 1F and the minimum spacing between adjacent control gates is about 1F, meaning each cell occupies at least a minimum of 2F in the X-direction and 2F to 2.5 F in the Y-direction.

It would be desirable to increase the integration density of FLASH memory arrays. Therefore, it is desired to provide a FLASH memory cell having a cell size that is not limited by the minimum line width that can be produced by lithography techniques used in the manufacturing of the FLASH device.

SUMMARY OF THE INVENTION

A FLASH memory device is provided including: a first group of floating gates including a plurality of first floating gates formed over a gate oxide layer formed over a substrate, the first group of floating gates being formed using a selected photolithography process associated with a minimum line width; a second group of floating gates including a plurality of second floating gates, wherein the first and second floating gates are disposed in series, with individual ones of the second floating gates disposed between respective ones of the first floating gates; a plurality of spacers, individual ones of the spacers disposed between adjacent ones of the first and second floating gates; a plurality of control gates associated with the floating gates, wherein the spacers and/or the second floating gates have widths less than the minimum line width.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION OF THE INVENTION

Figure 1:
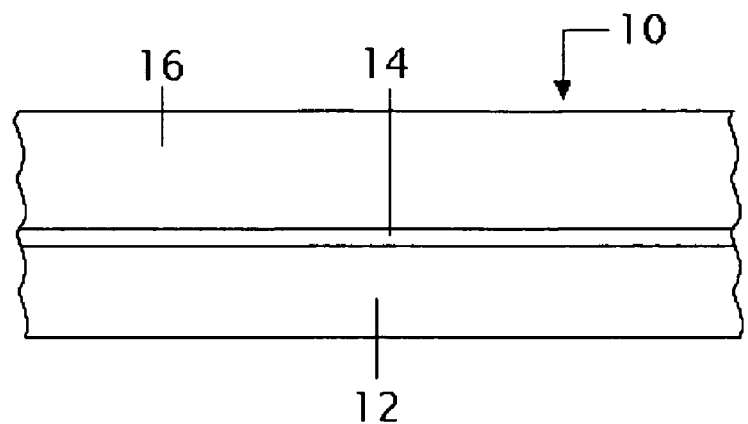
FIGS. 1-16 are top and cross-sectional schematic views illustrating the formation of an array of FLASH memory cells.

FIG. 1 discloses a semiconductor assembly 10 having several interlayers, including a substrate 12, upon which transistors and interconnects are fabricated. The substrate 12 can be, for example, a silicon substrate, silicon-germanium substrate, III-V compound substrate, or any other substrate that can substantially perform the same function of the substrate 12. A tunnel gate oxide 14 is formed as a dielectric layer between the substrate 12 and the devices formed thereon. The layer 14 can be formed by, for example, chemical vapor deposition (CVD) or, more preferably, by a thermal growth process. In an exemplary embodiment, the tunnel gate oxide layer is silicon oxide having a thickness between about 50-100 Å.

A first polysilicon layer 16 is formed over the tunnel gate oxide 14 by, for example, a CVD or spin-on coating, for example.

Figure 2:
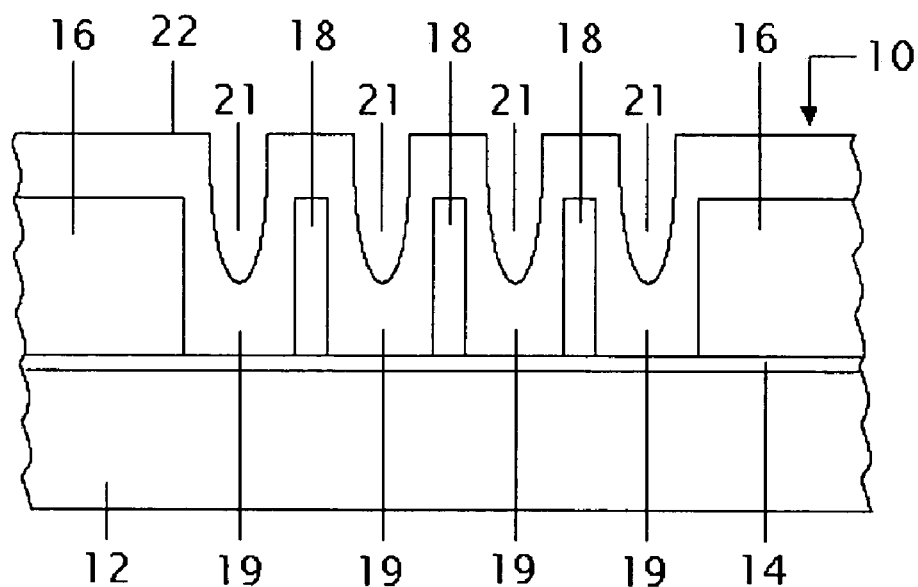

As shown in FIG. 2, the deposited polysilicon layer 16 is patterned to form a first group of polygates 18 that will serve as a first group of floating gates. For example, the first polysilicon layer 16 is patterned by photolithography techniques familiar to those in the art. In one embodiment, each of the polygates 18 is formed with a minimum line width (1F) that can be produced by a selected photolithography process used in the patterning step.

FIG. 2 further illustrates that a spacing material layer 22 including a silicon oxide layer or SiN (Silicon Nitride) layer, for example, is conformally deposited to cover the patterned, first polysilicon layer 16 and polygates 18. The layer 22 partially fills openings 19 (defined as the area between the polygates 18 by the patterning step), leaving recessed openings 21 in layer 22 in openings 19.

Figure 3:
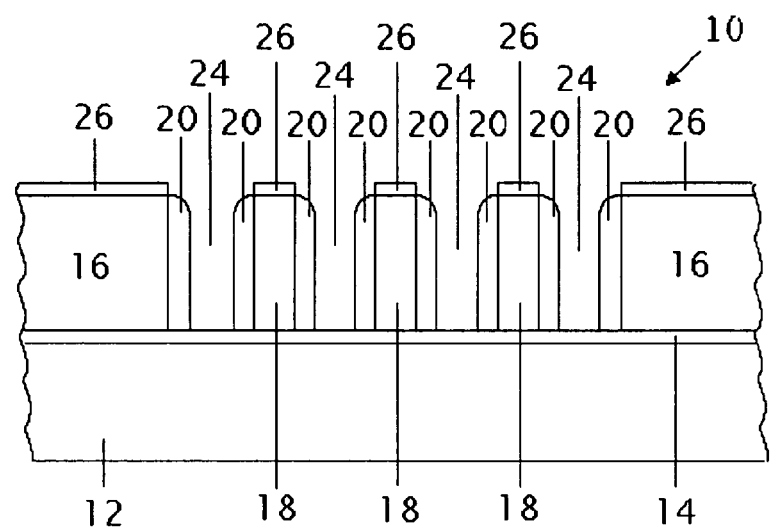

As shown in FIG. 3, the layer 22 is etched to form first spacers 20 adjacent to each polygate 18 in openings 19. Adjacent spacers 20 are separated by an opening 24. A selective isotropic dry etch may be used on the layer 22 to produce spacers 20 and each of the openings 24, essentially extending openings 21 to form openings 24 down to tunnel gate oxide layer 14. No mask is required to define openings 24, as the selected dry etch process is highly reactive to the spacer material 22 and not the polysilicon material. Openings 24 can be narrower than the minimum line width (1F). In one embodiment though, openings 19 between polygates 18 are wider than 1F and openings 24 have a width approximately equal to the width of polygates 18, i.e., approximately 1F.

In one embodiment, where the spacer material 22 comprises an oxide, the dry etchant includes a $CHF_3/CHF_4/He$ etch chemistry. In another embodiment, where the spacer material 22 comprises SiN, the dry etch process utilizes an $Ar/CF_4$ etch chemistry.

When the polysilicon layer 16 is patterned to form the polygates 18 having minimum line width, each of the openings 19 is formed to have a width that measures wide enough to contain an opening 24 and a pair of spacers 20 beside the respective openings 24. Each of the openings 19 is formed with a width having a measurement greater than about the minimum line width that can be produced by photolithography. As explained below, each of the openings 24 is used to form a second group of polygates 18a (FIG. 6), with polygates 18a intermediate adjacent polygates 18. In order to minimize the spacing of the polygates, the openings 19 are preferably less than about three times the minimum line width. Lithography techniques may be used to accurately form openings 19. In one embodiment, each of the openings 24 has a width less than or equal to the minimum line width, and more preferably equal to the minimum line width so as to match the width of polygates 18. Each of the spacers 20 preferably has a width narrower than the minimum line width to fit beside the openings 24. In one embodiment, both spacers 20 and openings 24 can have widths smaller than the minimum line width because they are formed by a selective dry etch process, rather than lithography.

By way of example, for a 0.11 μm lithography generation, the following features may have the following width dimensions: polygates 18 (0.11 μm); openings 19 (0.17 μm); openings 24 (0.11 μm) and spacers 20 (0.03 μm).

After forming each opening 24 by dry etching, it may be necessary to reform portions of tunnel gate oxide 14 in openings 24 that were damaged or removed during the etch process described above used to form openings 24. In one embodiment, a thin oxide (e.g., 40 Å) is applied by thermal process over the wafer. As part of this process, oxide layer 26 is also formed and covers the patterned first polysilicon layer 16. In one embodiment, a wet etch process may be used to remove this thin oxide formed on the substrate surface in order to remove any damage to the surface of substrate 12 induced by the etch process used to form openings 24. The tunnel gate oxide layer 14 is then reformed (such as by regrowth) in openings 24.

Figure 4:
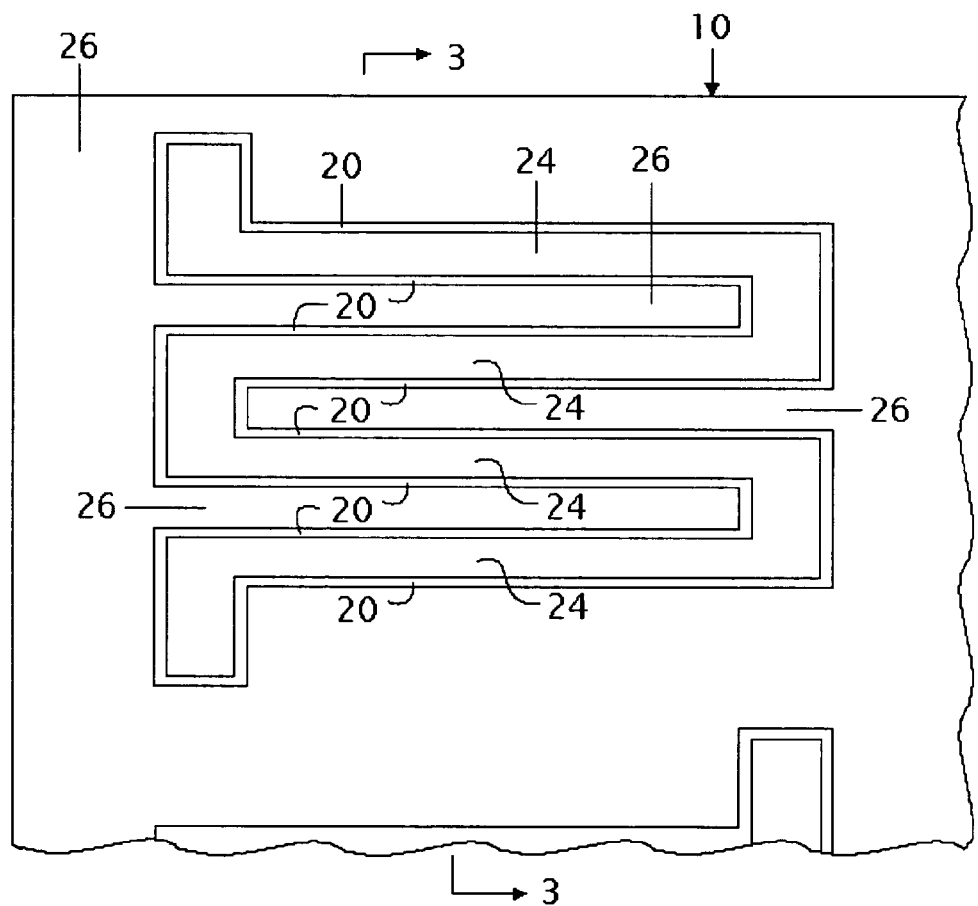

FIG. 4 is a top view of the structure of FIG. 3. The polysilicon layer 16 is preferably patterned to form a serpentine pattern. The openings 24 and spacers 20 define a serpentine pattern, with the first floating gates formed by the polygates 18 extending between the legs of the serpentine pattern. The periphery of polysilicon layer 16 adjacent the serpentine pattern can be used to form the polygates of periphery transistors, such as selection transistors and other transistors used in the logic of the integrated circuit.

Figure 5:
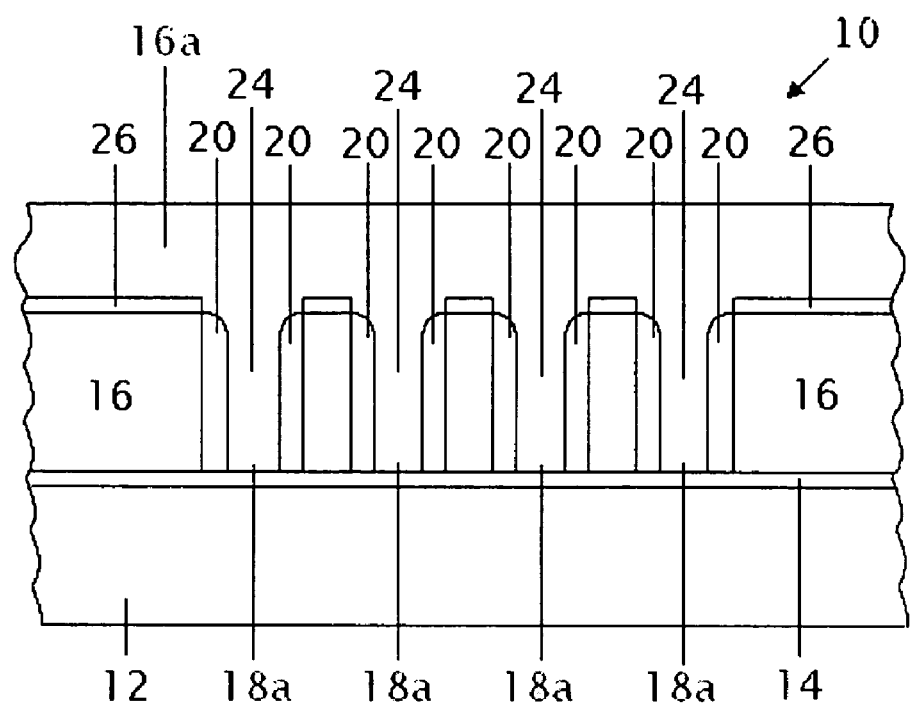

As shown in FIG. 5, a second polysilicon layer 16a is deposited over patterned polysilicon layer 16. The second polysilicon layer 16a fills the openings 24 formed between first spacers 20 to produce a second group of polysilicon gates including a plurality of spaced polygates 18a. As discussed above, in one embodiment, each opening 24 is preferably equal to a minimum line width that can be produced by photolithography techniques used to form polygates 18. Accordingly, each of the additional polygates 18a filling a corresponding opening 24 is equal to the minimum line width that can be produced by photolithography. However, because spacers 20 can be narrower than the minimum line width, more polygates can be formed in a given area, thereby reducing cell size and increasing the density of the memory device.

Figure 6:
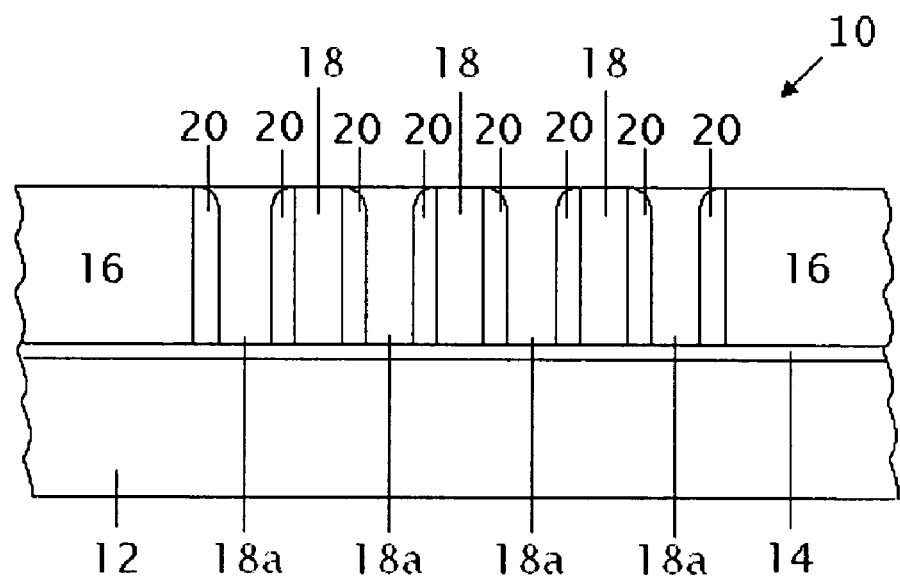

As shown in FIG. 6, the second polysilicon layer 16a is selectively etched back to polysilicon layer 16. Oxide layer 26 is also preferably removed during this etch process, thereby, producing a complete patterned polygate layer having multiple floating gates formed by the polygates 18 and 18a. Oxide layer 26 may serve as an etch stop in this removal process. One exemplary etchant gas chemistry that is selective to polysilicon over $SiO_2$ can be $Cl_2/HBr$ gas. Alternatively, a chemical mechanical polishing (CMP) process may be used.

Figure 7:
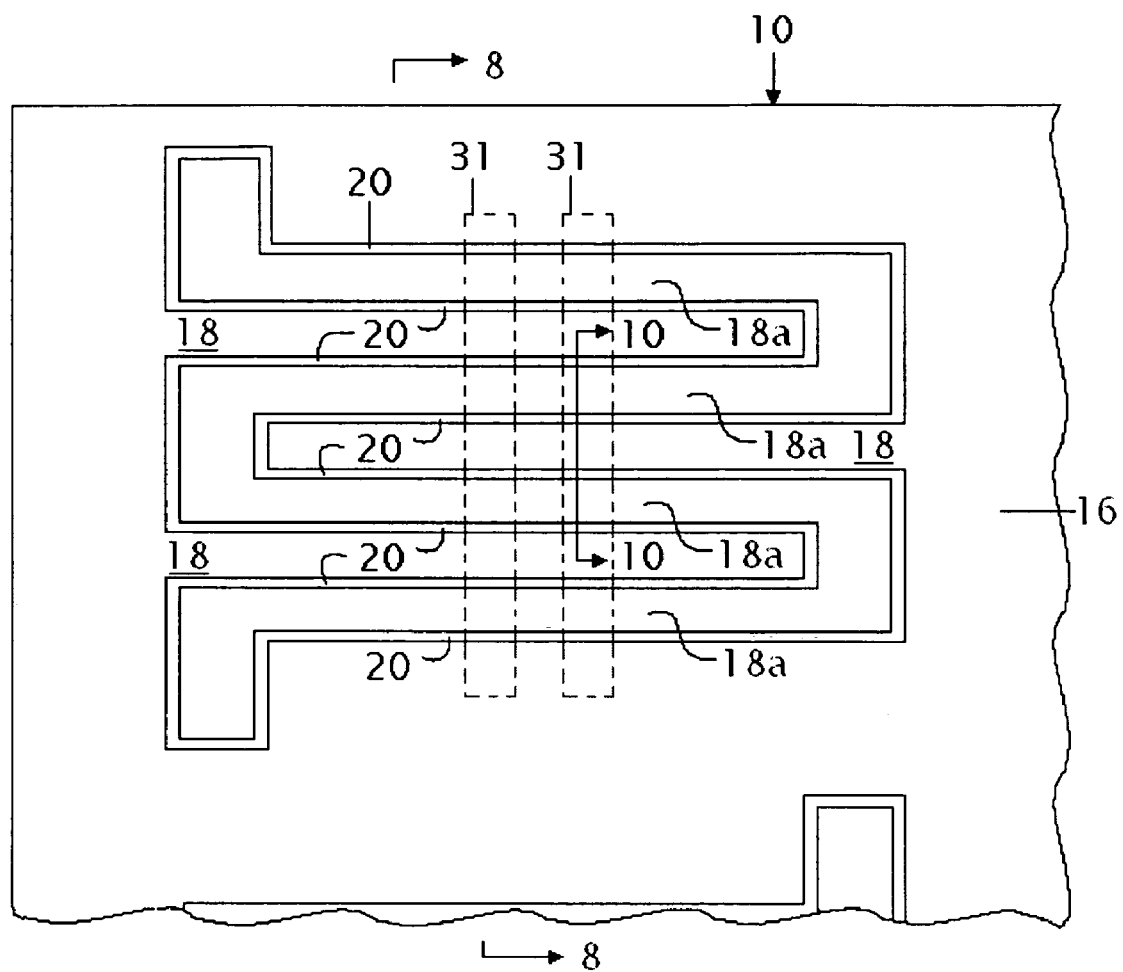

FIG. 7 is a top view of the complete patterned polygate layer having the first spacers 20 providing electrical isolation between the polygates 18 and 18a.

Figure 8:
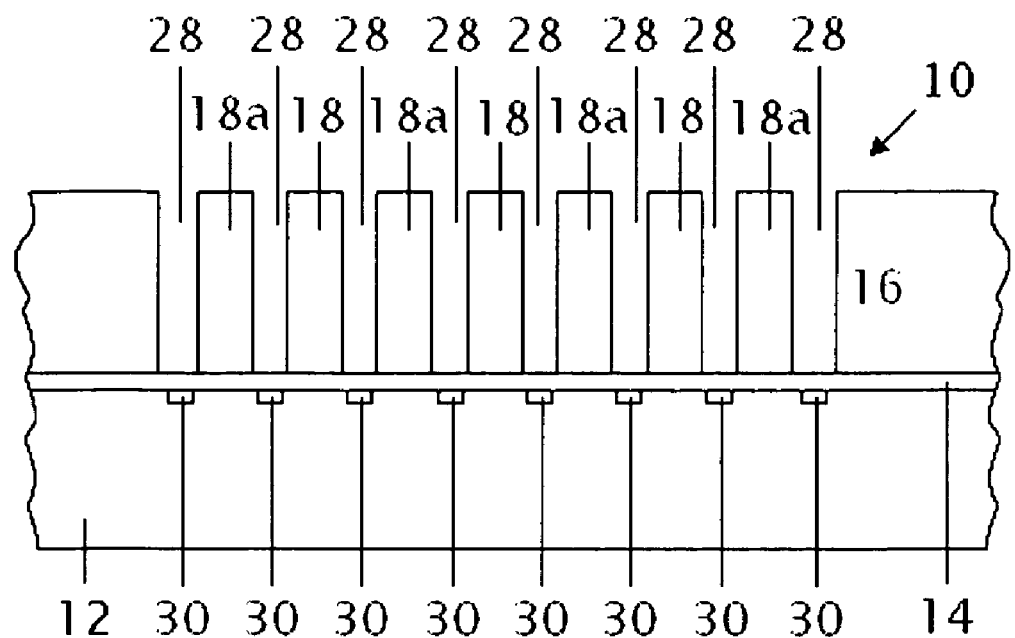

As shown in FIG. 8 (which is a cross-sectional view taken along lines 8-8 of FIG. 7), first spacers 20 are removed, such as by selective dry etching, for example, to provide openings 28 between the polygates 18 and 18a. The openings 28 extend down to the tunnel gate oxide layer 14. When the first spacers 20 comprise the same oxide as the top oxide 26 (FIG. 5), then one oxide etching step may be employed to remove both the top oxide 26 and the first spacers 20. When the first spacers 20 are made of SiN, then a selective SiN dry etch step is performed to remove the first spacers 20 from between the polygates 18 and 18a. In one exemplary embodiment, the etchant chemistry comprises an $Ar/CF_4$ gas.

After removal of spacers 20, shallow ion implants 30 are formed in the substrate 12 and below the openings 28. Ion implantation is performed according to an industry known process. For example, n+ ions are implanted in a p-type substrate 12. The n+ ion implants form transistor source and drain regions for a corresponding MOSFET transistor memory cell. Further, the multiple pairs of ion implants 30 are in series across the floating gates formed by the polygates 18 and 18a to provide series connected MOSFET transistor memory cells. For example, a series array or string of 16 to 32 series connected transistors is applied in a 256 megabyte to several gigabyte FLASH memory chip.

According to one alternative embodiment, the ion implantation is not performed to implant multiple ion implants 30 for respective MOSFET memory cell transistors, and thus openings 28 are not needed. As an alternative to forming ion implants 30, and as described in more detail below, a fringe field is induced in the substrate 12 by the charge voltage of the current carrying word lines 34 (FIG. 14) to turn on the substrate surface under the layer 20. This fringe field effect can be relied on to couple the transistors together in a series.

Figure 9:
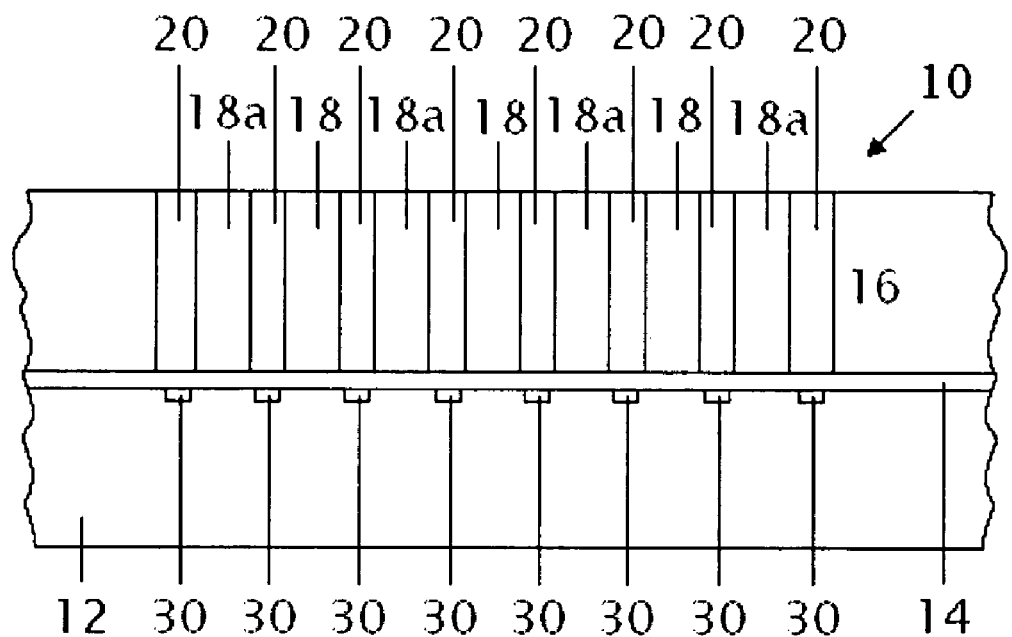
Figure 10:
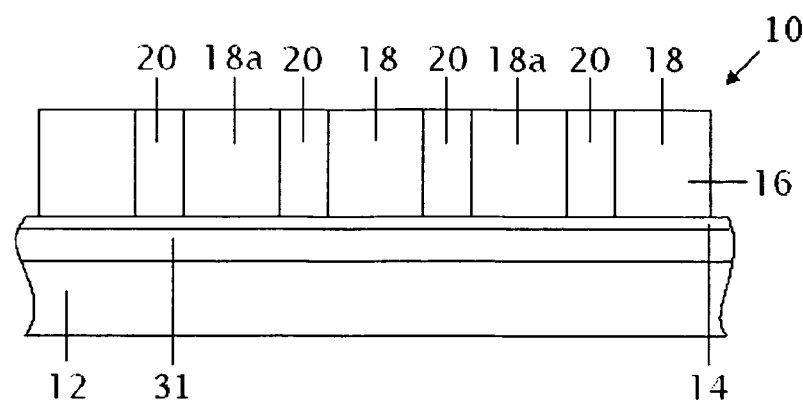

As shown in FIG. 9, the openings 28 are next filled by an oxide deposition or SiN deposition to restore the spacers 20 over the ion implants 30. The elongated spacers 20 provide corresponding electrical isolation between polygates 18 and 18a. Further, although not specifically shown, a string of 16 to 32 ion implants 30 and corresponding memory transistors can be provided to provide a transistor string. Also, each pair of the ion implants 30 for a corresponding transistor is near an adjacent transistor STI (Shallow Trench Isolation) region 31 (FIG. 10, which is a cross-sectional view of FIG. 7 taken along lines 10-10) in the substrate 12 for isolating the respective transistor. As one of ordinary skill will recognize, the STI regions are formed prior to formation of polysilicon layer 16. Although only two shallow trench isolations 31 are shown in phantom in FIG. 7, this is for illustrative purposes only. One of ordinary skill will understand that integrated circuits often include thousands of STI regions 31.

Figure 11:
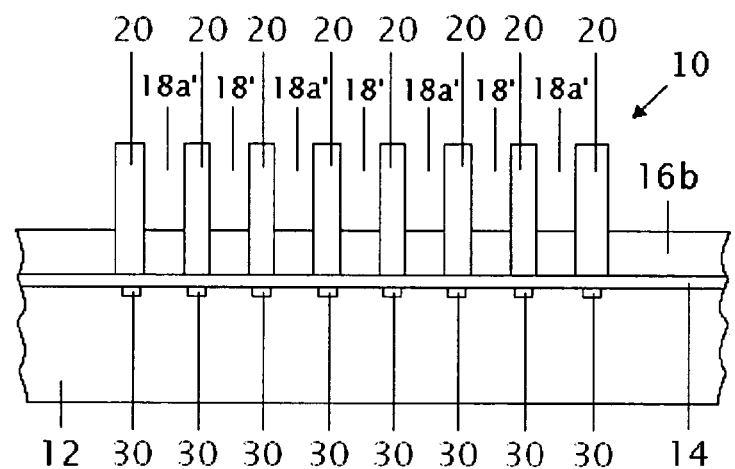

As shown in FIG. 11, the floating gate polygate layer (including peripheral polysilicon region 16 and polygates 18 and 18a) is etched back to a targeted thickness, or a desired thickness, to form polygate layer 16b having polygates 18a' and 18'. In one embodiment, the etch process may be a time-mode selective dry etch process that controls the remaining poly gate thickness using a $Cl_2/HBr$ gas. In this embodiment, the restored spacers 20 project above the floating gate polygate layer.

Figure 12:
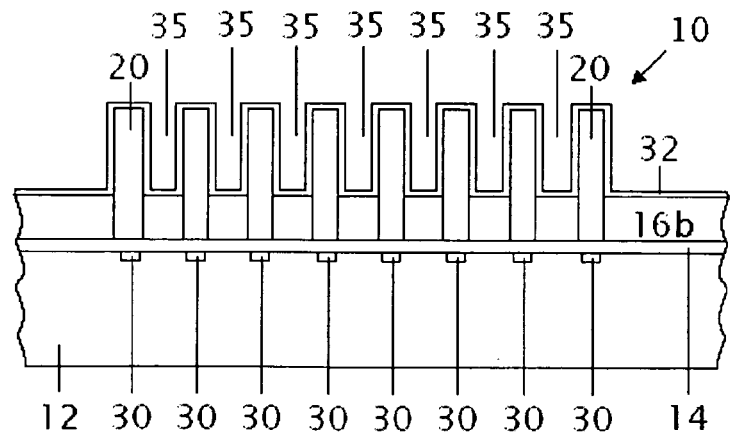

Next, as shown in FIG. 12, a dielectric layer 32, such as an ONO (Oxide/Nitride/Oxide) layer is formed to provide an electrical isolation coating on each floating gate provided by the polygates 18' and 18a'. The layer 32 is preferably conformally deposited so that openings 35 remain between respective spacers 20 and above each floating gate. In one embodiment, the ONO spacers can be deposited by LPCVD (low pressure chemical vapor deposition). The bottom oxide and top oxide layers can be formed by a gas of $SiH_2Cl_2/O_2$ and the sandwiched nitride layer can be formed by a gas of $SiH_2Cl_2/N_2$. The thicknesses are preferably around 20 Å, 80 Å, 40 Å for top oxide, nitride, and bottom oxide layers respectively. The thicknesses are controlled using deposition process parameters familiar to those in the art.

Figure 13:
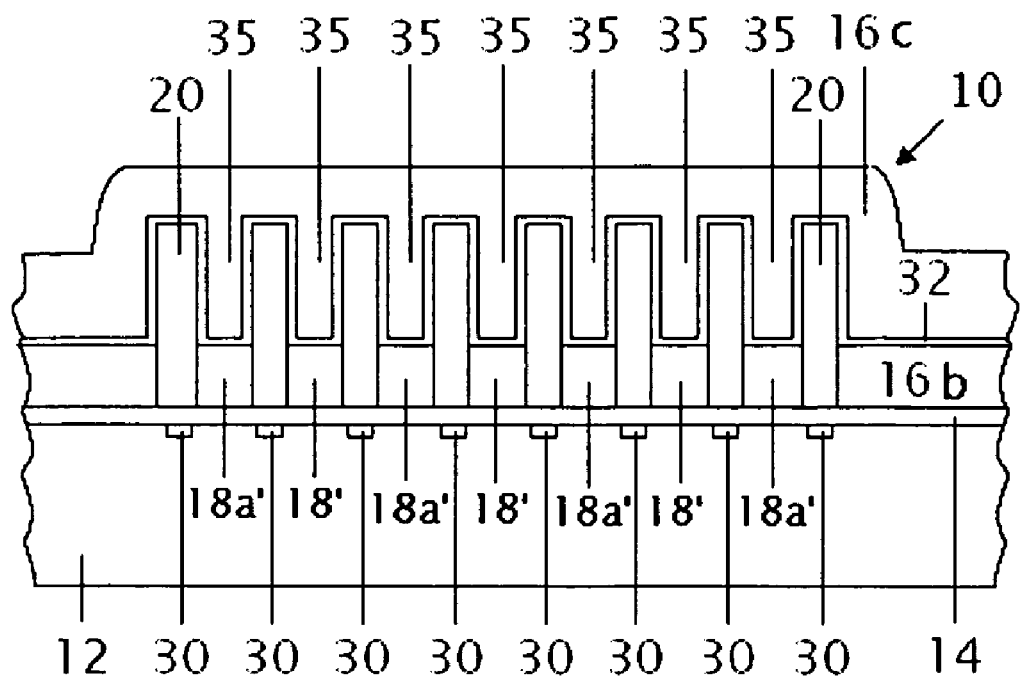

A control gate layer is then formed by first depositing a third polysilicon layer 16c over the ONO layer 32, as shown in FIG. 13. The polysilicon layer 16c fills the openings 35, and is separated from the floating gates 18a', 18' by dielectric layer 32. The third polysilicon layer 16c is applied, for example, by repeating a polysilicon deposition step as disclosed hereinabove.

Figure 14:
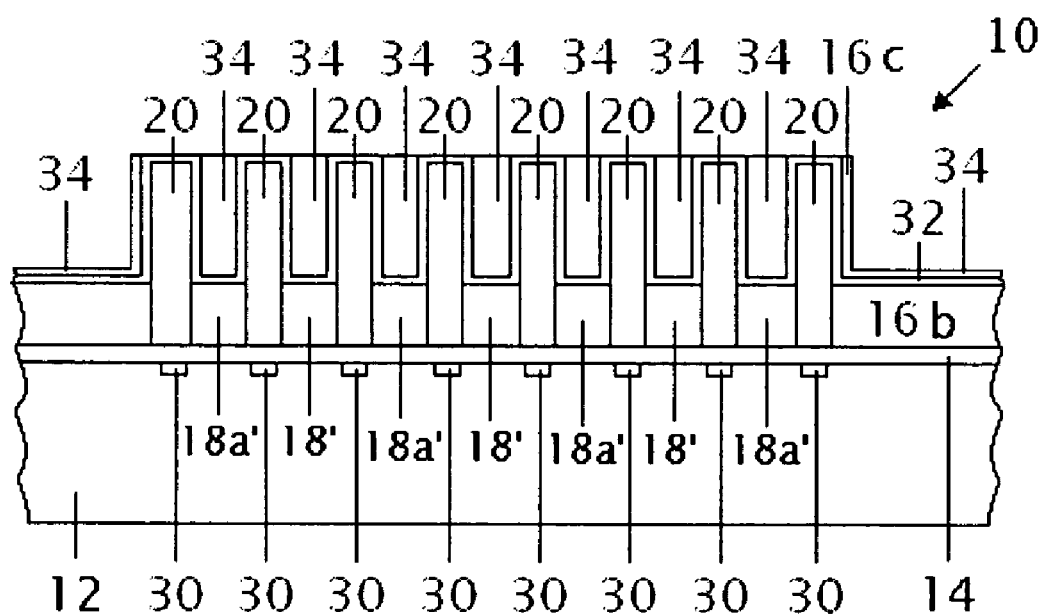

As shown in FIG. 14, the third polysilicon layer 16c is then selectively etched back to provide word lines formed by control gates 34 formed in the openings 35 (FIG. 13) in the ONO dielectric layer 32. A selective dry etching using an etch gas of $HBr/Cl_2$ may be used, using the ONO layer as an etch stop layer.

A fringe field effect is induced by the fringing field capacitance of the substrate 12 under respective spacers 20 with both the floating gates of the polygates 18' and 18a', and the control gates of the word lines 34. When a control gate is biased with a bias voltage, or when one of the floating gates has a retained charge, it is possible for the substrate surface to form an inversion layer (or channel), which acts like an implant 30 to series connect neighboring cells. Then, the fringe field effect serves as an alternative to providing the source and drain ion implants 30. Accordingly, relying on the fringe field effect can eliminate the need for the above-described steps of, removing the first spacers 20, implanting the ion implants 30 and restoring the first spacers 20.

Further, the word lines 34 are beside and against respective ONO covered spacers 20 that provide electrical isolation between the word lines 34. The width of each spacer 20 is preferably narrower than a minimum line width that can be produced by photolithography. Further, the width of each ONO covered spacer 20 is narrower than a minimum line width that can be produced by photolithography. The spacing between the floating gates is the width of spacer 20, i.e., around 300 Å. The control gate 34 has a narrower width than the floating gate. The difference in width is about twice the ONO thickness. If floating gate width is 0.11 μm and ONO width is about 0.014 μm, then control gate 34 will be about 0.11 μm-0.014 μm*2 or 0.082 μm.

Figure 15:
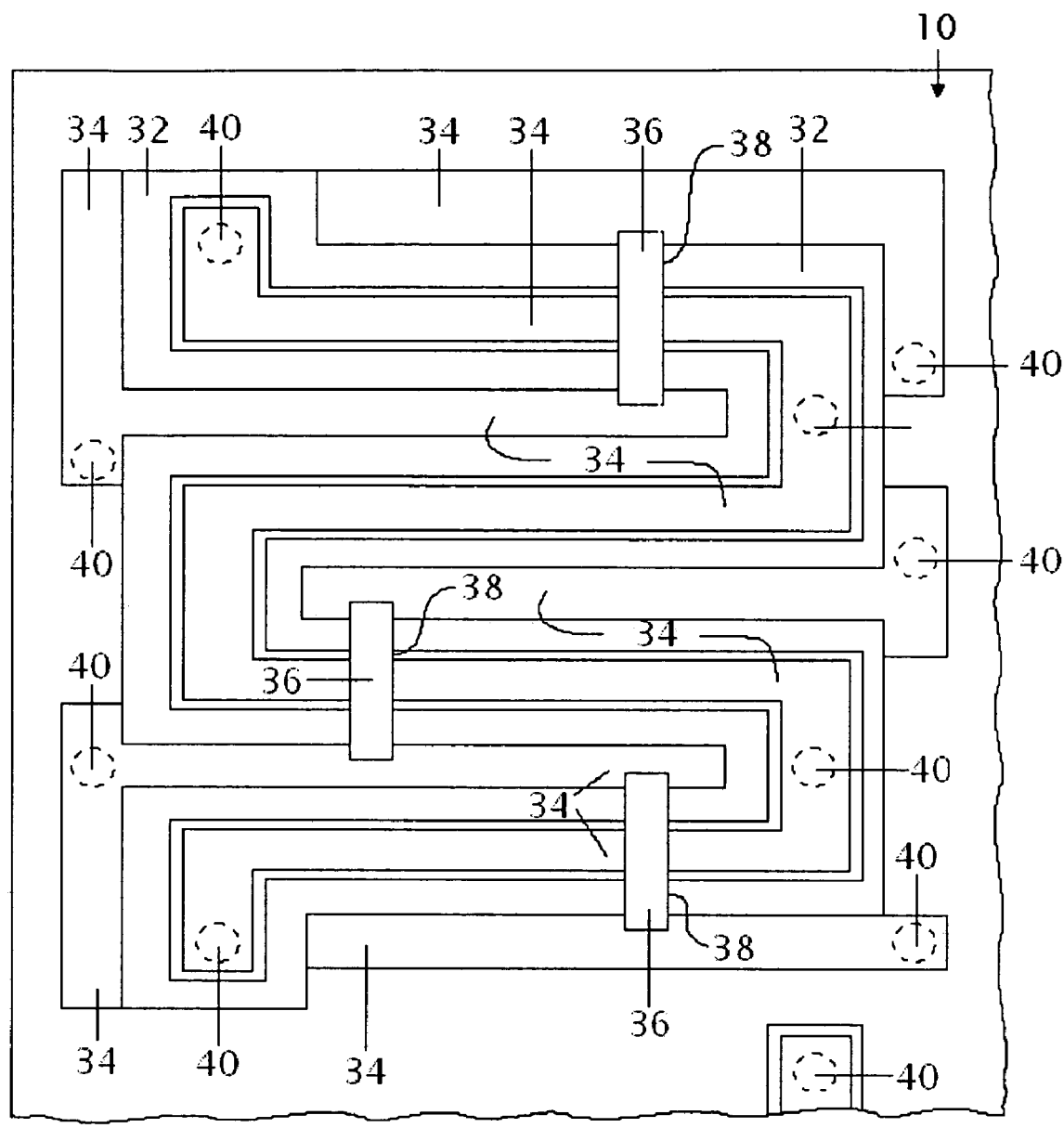

Top view FIG. 15 shows mask areas 36 for locating transverse cuts 38, thereby, transversely severing each of the word lines 34 in the serpentine pattern to form independent word lines 34. Further, FIG. 15 discloses holes formed for exposing areas of electrical contacts 40 on respective control gates that are formed by word lines 34. The electrical contacts 40 are for establishing electrical interconnection of an EEPROM gate control line (not shown) to respective word lines 34.

Figure 16:
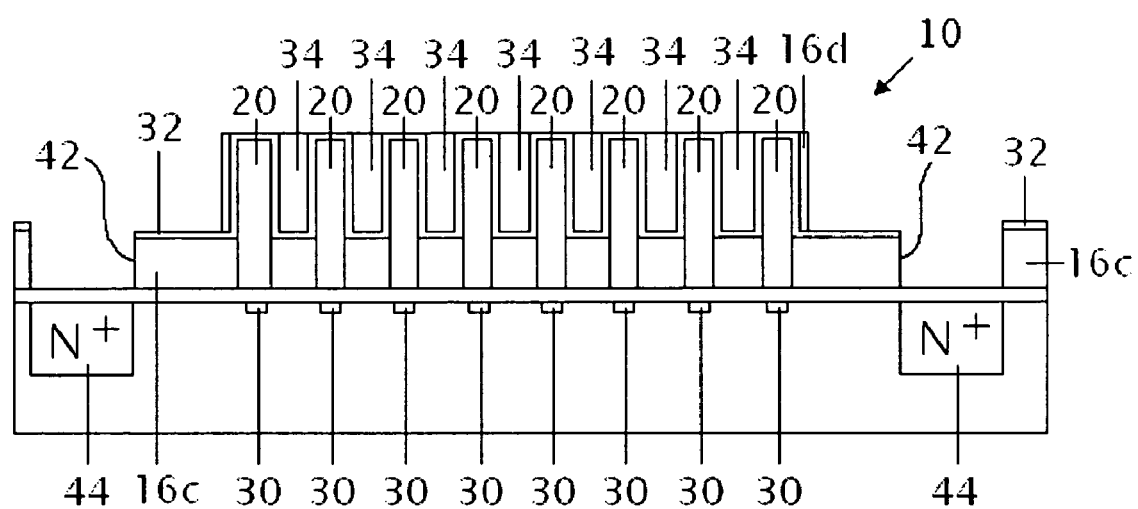

FIG. 16 shows an opening 42 formed through the ONO layer 32 and the bottom polysilicon layer 16b. For example, the openings 42 are produced by masking the entire structure except at the locations of the openings 42, followed by selectively etching the ONO layer 32 at the locations of the openings 42, followed by selectively etching the bottom, floating gate polygate layer 16b. A source/drain N+ ion implant 44 of a single-gate MOSFET selection transistor is implanted in the substrate 12 below the opening 42. Each word line 34 is connected though a corresponding selection transistor to an EEPROM gate control line (not shown), as further disclosed by the 125 Patent, for example, the entirety of which is hereby incorporated by reference herein.

One of ordinary skill will understand that a completed FLASH memory device as described herein may also include selection, control, read/write, sensing and other circuitry not shown herein, but familiar to those in the art. Examples of such circuitry are also shown in the '125 Patent.

Assuming a technology generation having a minimum line width (F) of 0.11 μm, and assuming polygates 18 and 18a each have widths about or equal to the minimum line width, then each cell in the above-described example has a dimension in the X direction of about 0.11 μm+0.03 μm (the width of spacers 20). Assuming the cell size in the Y direction is about 2.5F, then the cell area for 0.11 μm generation FLASH memory is less than about $3.2F^2$. This reduced cell size provides for significant increases in, for example, memory capacity and costs.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A FLASH memory device, comprising:
   a first group of floating gates comprising a plurality of first floating gates formed over a gate oxide layer formed over a substrate, said first group of floating gates being formed using a selected photolithography process associated with a minimum line width;
   a second group of floating gates comprising a plurality of second floating gates, wherein said first and second floating gates are disposed in series, with individual ones of said second floating gates disposed between respective ones of said first floating gates;
   a plurality of spacers, individual ones of said spacers disposed between adjacent ones of said first and second floating gates;
   a plurality of control gates associated with said floating gates, respective ones of said control gates disposed on top of said floating gates,
   wherein adjacent ones of said first and second floating gates are each spaced from one another a substantially uniform distance less than said minimum line width and wherein said second floating gates have widths less than said minimum line width.

2. The memory device of claim 1, wherein a width of at least some of said control gates is less than said minimum line width.

3. The memory device of claim 2, wherein said spacers have a height greater than the first and second floating gates, wherein said control gates are disposed at least in part between said spacers.

4. The memory device of claim 3, further comprising a dielectric layer disposed underneath said control gates between said controls gates and floating gates.

5. The memory device of claim 1, further comprising doped source/drain regions implanted within said substrate below said spacers.

6. The memory device of claim 1, wherein said first floating gates are spaced from each other a distance less than about three times said minimum line width.

7. The memory device of claim 1, wherein the width of said individual ones of said spacers defines the spacing between the adjacent ones of said first and second floating gates.

8. A FLASH memory device, comprising:
   a plurality of series coupled floating gates formed over a gate oxide layer formed over a substrate, said floating gates having widths corresponding to about a minimum line width associated with a selected photolithography process used in the formation of at least some of said plurality of floating gates;
   a plurality of spacers, individual ones of said spacers disposed between and separating adjacent ones of said plurality of floating gates, wherein said spacers have widths less than said minimum line width, the width of said individual ones of said spacers defining the separation between the adjacent floating gates such that adjacent ones of said floating gates are each spaced from one another a substantially uniform distance less than said minimum line width; and a plurality of control gates associated with said floating gates.

9. The FLASH memory device of claim 8, further comprising a dielectric layer disposed between said control gates and floating gates, wherein said spacers have a height greater than the height of said floating gates, and wherein said control gates are disposed at least in part above said floating gates and between said spacers, whereby a width of at least some of said control gates is less than said minimum line width.

10. The FLASH memory device of claim 9, further comprising doped source/drain regions implanted within said substrate below said spacers.

11. The FLASH memory device of claim 8, wherein respective ones of said control gates are disposed on top of said floating gates.

12. The FLASH memory device of claim 8, further comprising doped source/drain regions implanted within said substrate below said spacers, wherein said doped/source drain regions have a width about equal to the width of said spacers.

13. The FLASH memory device of claim 5, wherein said doped/source drain regions have a width about equal to the width of said spacers.

14. A FLASH memory device, comprising:

a plurality of series coupled floating gates formed over a gate oxide layer formed over a substrate, said floating gates having widths corresponding to about a minimum line width associated with a selected photolithography process used in the formation of at least some of said plurality of floating gates;

a plurality of spacers, individual ones of said spacers disposed between and separating adjacent ones of said floating gates to define the separation therebetween, wherein said spacers have widths less than said minimum line width and wherein adjacent ones of said floating gates are each spaced from one another a substantially uniform distance less than said minimum line width;

a plurality of control gates associated with said floating gates; and doped source/drain regions implanted within said substrate below said spacers, wherein said doped/source drain regions have a width about equal to the width of said spacers.

15. The FLASH memory device of claim 14, wherein respective ones of said control gates disposed on top of said floating gates and separated from said floating gates by a dielectric layer.

16. The FLASH memory device of claim 15, wherein said spacers have a height greater than the height of said floating gates, and wherein said control gates are disposed between said spacers, whereby a width of at least some of said control gates is less than said minimum line width.

* * * * *

UNITED STATES PATENT AND TRADEMARK OFFICE
CERTIFICATE OF CORRECTION

| | | |
|---|---|---|
| PATENT NO. | : 7,585,724 B2 | Page 1 of 1 |
| APPLICATION NO. | : 11/125867 | |
| DATED | : September 8, 2009 | |
| INVENTOR(S) | : Chung-Zen Chen | |

It is certified that error appears in the above-identified patent and that said Letters Patent is hereby corrected as shown below:

Cover page, item (56) References Cited, U.S. PATENT DOCUMENTS, add --2003/0022443 A1 1/2003 Chen--

Signed and Sealed this

Twentieth Day of October, 2009

David J. Kappos
*Director of the United States Patent and Trademark Office*